(12) United States Patent
Park et al.

(10) Patent No.: US 10,727,354 B2
(45) Date of Patent: Jul. 28, 2020

(54) SEMICONDUCTOR DEVICE HAVING VERTICAL CHANNEL AND METHOD OF MANUFACTURING THE SAME

(71) Applicant: SAMSUNG ELECTRONICS CO., LTD., Suwon-si, Gyeonggi-do (KR)

(72) Inventors: Sung Il Park, Suwon-si (KR); Jung Gun You, Ansan-si (KR); Dong Hun Lee, Seoul (KR); Yun Il Lee, Anyang-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 15/944,175

(22) Filed: Apr. 3, 2018

(65) Prior Publication Data

US 2019/0081180 A1    Mar. 14, 2019

(30) Foreign Application Priority Data

Sep. 13, 2017    (KR) .......................... 10-2017-0117048

(51) Int. Cl.
*H01L 29/78*    (2006.01)
*H01L 29/786*    (2006.01)
(Continued)

(52) U.S. Cl.
CPC .... *H01L 29/78642* (2013.01); *H01L 29/0653* (2013.01); *H01L 29/0847* (2013.01);
(Continued)

(58) Field of Classification Search
CPC ..... H01L 21/823431; H01L 21/823821; H01L 27/0886; H01L 29/7827; H01L 29/66666; H01L 29/66795–66818; H01L 29/78642; H01L 29/785–7856; H01L 2029/7857; H01L 2029/7858
See application file for complete search history.

(56) References Cited

U.S. PATENT DOCUMENTS 7,586,130 B2    9/2009    Kawashima et al.
9,373,620 B2    6/2016    Wang et al.
(Continued)

FOREIGN PATENT DOCUMENTS

KR    10-0779300 B1    11/2007
KR    10-2016-0059448 A    5/2016
(Continued)

*Primary Examiner* — Eric A. Ward
(74) *Attorney, Agent, or Firm* — Lee IP Law, PC

(57) ABSTRACT

A semiconductor device includes a substrate; a vertical channel structure including a pair of active fins extended in a first direction, perpendicular to an upper surface of the substrate, and an insulating portion interposed between the pair of active fins; an upper source/drain disposed on the vertical channel structure; a lower source/drain disposed below the vertical channel structure and on the substrate; a gate electrode disposed between the upper source/drain and the lower source/drain and surrounding the vertical channel structure; and a gate dielectric layer disposed between the gate electrode and the vertical channel structure. An interval between the gate electrode and the upper source/drain may be smaller than an interval between the gate electrode and the lower source/drain in the first direction.

19 Claims, 16 Drawing Sheets

(51) Int. Cl.
  *H01L 29/06* (2006.01)
  *H01L 29/66* (2006.01)
  *H01L 29/49* (2006.01)
  *H01L 29/423* (2006.01)
  *H01L 29/08* (2006.01)

(52) U.S. Cl.
  CPC .... *H01L 29/42392* (2013.01); *H01L 29/4908* (2013.01); *H01L 29/66553* (2013.01); *H01L 29/66666* (2013.01); *H01L 29/7827* (2013.01); *H01L 29/42376* (2013.01); *H01L 2029/42388* (2013.01)

(56) References Cited

U.S. PATENT DOCUMENTS

| | | | |
|---|---|---|---|
| 9,508,858 B2 | 11/2016 | Diaz et al. | |
| 9,653,575 B1* | 5/2017 | Basker | H01L 29/66666 |
| 9,698,261 B2 | 7/2017 | Wang et al. | |
| 9,773,705 B2 | 9/2017 | Ching et al. | |
| 9,780,208 B1* | 10/2017 | Xie | H01L 21/324 |
| 9,935,018 B1* | 4/2018 | Xie | H01L 21/823885 |
| 2006/0027869 A1 | 2/2006 | Kim et al. | |
| 2017/0323977 A1* | 11/2017 | Cheng | H01L 29/7827 |
| 2017/0365673 A1* | 12/2017 | Cheng | H01L 29/785 |
| 2017/0373188 A1* | 12/2017 | Mochizuki | H01L 29/7827 |
| 2018/0233501 A1* | 8/2018 | Balakrishnan | H01L 27/092 |
| 2018/0269312 A1* | 9/2018 | Xie | H01L 29/66666 |

FOREIGN PATENT DOCUMENTS

| | | |
|---|---|---|
| KR | 10-1656946 B1 | 9/2016 |
| KR | 10-1682775 B1 | 11/2016 |
| KR | 10-1735205 B1 | 5/2017 |

* cited by examiner

I-I'

A

II-II'

SEMICONDUCTOR DEVICE HAVING VERTICAL CHANNEL AND METHOD OF MANUFACTURING THE SAME

CROSS-REFERENCE TO RELATED APPLICATION

Korean Patent Application No. 10-2017-0117048, filed on Sep. 13, 2017 in the Korean Intellectual Property Office, and entitled: "Semiconductor Device Having Vertical Channel and Method of Manufacturing the Same," is incorporated by reference herein in its entirety.

BACKGROUND

1. Field

Embodiments relate to a semiconductor device having a vertical channel and a method of manufacturing the same.

2. Description of the Related Art

As a scaling technique to increase the density of semiconductor devices, multigate field effect transistors (FET) having an active pattern having the form of a fin or a nanowire suppressing a short channel effect have been proposed.

SUMMARY

Embodiments are directed to a semiconductor device that includes a substrate; a vertical channel structure including a pair of active fins extended in a first direction, perpendicular to an upper surface of the substrate, and an insulating portion interposed between the pair of active fins; an upper source/drain disposed on the vertical channel structure; a lower source/drain disposed below the vertical channel structure and on the substrate; a gate electrode disposed between the upper source/drain and the lower source/drain and surrounding the vertical channel structure; and a gate dielectric layer disposed between the gate electrode and the vertical channel structure. An interval between the gate electrode and the upper source/drain may be smaller than an interval between the gate electrode and the lower source/drain in the first direction.

Embodiments are also directed to a semiconductor device that includes a substrate; a first vertical channel structure including a pair of first active fins disposed at a first pitch and a first insulating portion interposed between the pair of first active fins on the substrate; a second vertical channel structure including a pair of second active fins disposed at the first pitch and a second insulating portion interposed between the pair of second active fins on the substrate; upper source/drains disposed on the first vertical channel structure and the second vertical channel structure; a lower source/drain disposed below the first vertical channel structure and the second vertical channel structure; and a gate electrode disposed between the upper source/drains and the lower source/drain and surrounding the first vertical channel structure and the second vertical channel structure. The pair of first active fins and the pair of second active fins may be disposed adjacent to each other, and may be disposed at a second pitch greater than the first pitch.

Embodiments are also directed to a method of manufacturing a semiconductor device that includes forming a plurality of active fins alternately disposed on a substrate at a first pitch and a second pitch, greater than the first pitch; forming an insulating portion between the plurality of active fins disposed at the first pitch; forming a lower source/drain on the substrate using an ion implantation process; forming an upper source/drain on the plurality of active fins using a selective epitaxial process; forming a first spacer on a side surface of the upper source/drain; forming a gate dielectric layer and a gate electrode to cover side surfaces of the plurality of active fins and the first spacer; and partially removing the gate dielectric layer and the gate electrode using an anisotropic etching process.

BRIEF DESCRIPTION OF THE DRAWINGS

Features will become apparent to those of skill in the art by describing in detail example embodiments with reference to the attached drawings in which.

DETAILED DESCRIPTION

Figure 1:
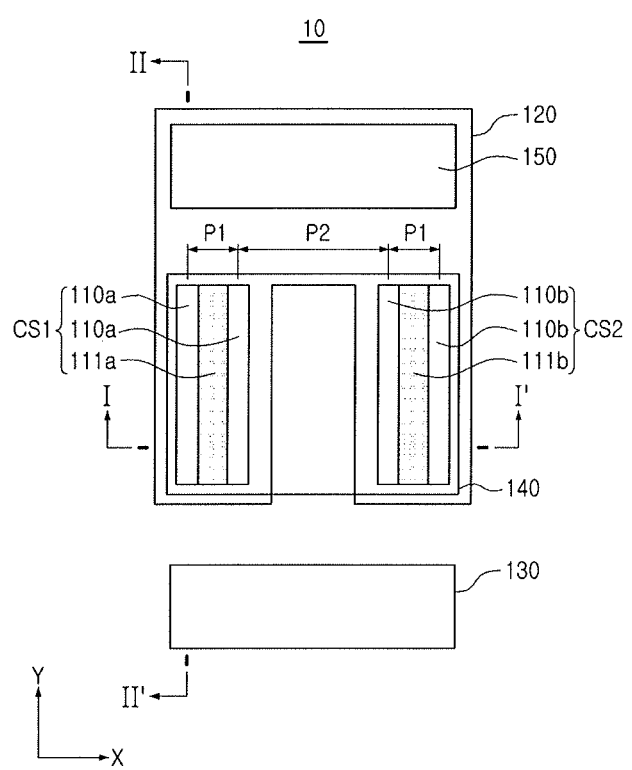
FIG. 1 is a layout of a semiconductor device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

Figure 2:
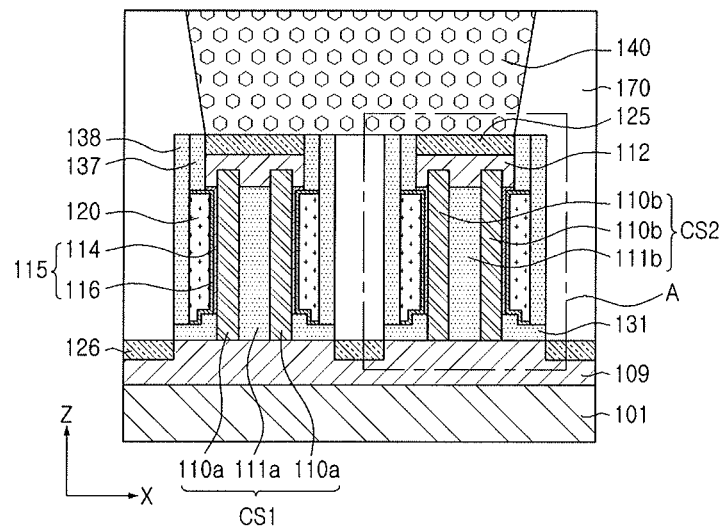
FIG. 2 illustrates a cross-sectional view taken along line I-I' of a semiconductor device illustrated in FIG. 1.
Figure 3:
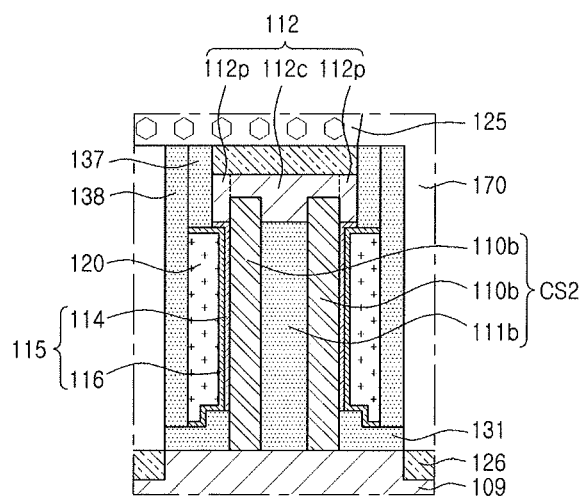
FIG. 3 illustrates an enlarged view of region A of FIG. 2.
Figure 4:
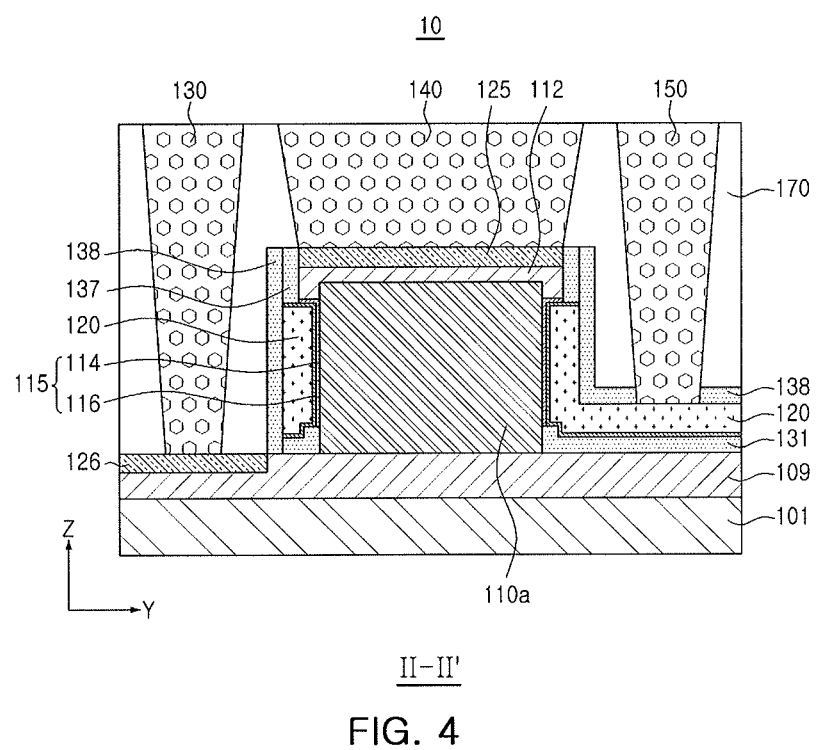
FIG. 4 illustrates a cross-sectional view taken along line II-II' of a semiconductor device illustrated in FIG. 1.

FIG. 1 is a layout of a semiconductor device 10 according to an example embodiment. FIG. 2 is a cross-sectional view taken along line I-I' of a semiconductor device illustrated in FIG. 1. FIG. 3 is an enlarged view of region A of FIG. 2. FIG. 4 is a cross-sectional view taken along line II-II' of a semiconductor device illustrated in FIG. 1.

With reference to FIGS. 1 to 4, the semiconductor device 10 may be provided as a vertical field effect transistor.

The semiconductor device 10 may include a substrate 101, a first vertical channel structure CS1, and a second vertical channel structure CS2.

The first vertical channel structure CS1 may include a pair of first active fins 110a disposed on the substrate 101 (arranged at a first pitch P1 in, for example, a third direction (for example, an X-axis direction)). The first active fins 110a may extend in a first direction (for example, a Z-axis direction) perpendicular to an upper surface of the substrate

101. The first vertical channel structure CS1 may also include a first insulating portion 111*a* interposed between the pair of first active fins 110*a*.

The second vertical channel structure CS2 may include a pair of second active fins 110*b* disposed on the substrate 101 (arranged at the first pitch P1) and extended in the first direction (for example, the Z-axis direction) perpendicular to the upper surface of the substrate 101. The second vertical channel structure CS2 may further include a second insulating portion 111*b* interposed between the pair of second active fins 110*b*.

The semiconductor device 10 may further include upper source/drains 112 disposed on the first vertical channel structure CS1 and the second vertical channel structure CS2; a lower source/drain 109 disposed below the first vertical channel structure CS1 and the second vertical channel structure CS2; a gate electrode 120 disposed between the upper source/drains 112 and a lower source/drain 109 and surrounding the first vertical channel structure CS1 and the second vertical channel structure CS2; and a gate dielectric layer 115 disposed between the gate electrode 120 and the first vertical channel structure CS1 and between the gate electrode 120 and the second vertical channel structure CS2.

The substrate 101 may include a semiconductor material, such as a group IV semiconductor, a group III-V compound semiconductor, or a group II-VI compound semiconductor.

A first active fin 110*a* and a second active fin 110*b*, disposed adjacent to each other, may be disposed at a second pitch P2 greater than the first pitch P1. For example, the first pitch P1 may be 30 nm or less, while the second pitch P1 may be 100 nm or less. The first active fins 110*a* and the second active fins 110*b* may include the same semiconductor material as the substrate 101.

The first active fins 110*a* and the second active fins 110*b* may extend in a second direction (for example, a Y-axis direction) intersecting the first direction. The first active fins 110*a* and the second active fins 110*b* may have a sheet shape in which a width in one direction is different from a width in the other direction. In another implementation, the first active fins 110*a* and the second active fins 110*b* may have a wire shape having a circular, oval, or polygonal cross section. The widths of the first active fins 110*a* and the second active fins 110*b* may be, for example, 10 nm or less. The first active fins 110*a* and the second active fins 110*b* may be referred to as a nanosheet or a nanowire.

In an example embodiment, an interval between the gate electrode 120 and the upper source/drains 112 is smaller than an interval between the gate electrode 120 and the lower source/drain 109 in the first direction perpendicular to the upper surface of the substrate 101. The interval between the gate electrode 120 and the upper source/drains 112 may be equal to a thickness of the gate dielectric layer 115.

The first vertical channel structure CS1 and the second vertical channel structure CS2 may provide a channel region having a silicon on insulator (SOI) structure. The first insulating portion 111*a* and the second insulating portion 111*b* may include, for example, a silicon nitride.

Upper surfaces of the first insulating portion 111*a* and the second insulating portion 111*b* may be disposed to be lower than upper surfaces of the first active fins 110*a* and the second active fins 110*b*. The upper surfaces of the first insulating portion 111*a* and the second insulating portion 111*b* may be disposed to be higher than an upper surface of the gate electrode 120. In an example embodiment, the upper surfaces of the first insulating portion 111*a* and the second insulating portion 111*b* may be disposed to be lower than the upper surface of the gate electrode 120. The upper source/drains 112 may be in contact with the first insulating portion 111*a* and the second insulating portion 111*b*.

Respective upper source/drains 112 may include protrusions 112*p* protruding beyond side surfaces of the first vertical channel structure CS1 and the second vertical channel structure CS2, as well as a central portion 112*c* between the protrusions 112*p*. A portion of the gate electrode 120 may overlap the protrusions 112*p* in the first direction. A length of the protrusions 112*p* protruding from the side surfaces of the first vertical channel structure CS1 and the second vertical channel structure CS2 may be greater than a thickness of the gate dielectric layer 115. The gate dielectric layer 115 may extend below the protrusions 112*p* of the upper source/drains 112.

The upper source/drains 112 may be provided as an epitaxial layer grown from the first active fin 110*a* and the second active fin 110*b* using a selective epitaxial growth (SEG) process. The upper source/drains 112 may be doped with impurities. In the case of an n-type field effect transistor, the upper source/drains 112 may be formed using silicon (Si) doped with an n-type impurity. In the case of a p-type field effect transistor, the upper source/drains 112 may be formed using silicon-germanium (SiGe) doped with a p-type impurity.

The lower source/drain 109 disposed below the first active fin 110*a* and the second active fin 110*b* may be provided as a region doped with impurities using an ion implantation process. In the case of the n-type field effect transistor, the lower source/drains 109 may be doped with the n-type impurity. In the case of the p-type field effect transistor, the lower source/drains 109 may be doped with the p-type impurity.

The semiconductor device 10 may further include a lower spacer layer 131 disposed between the gate electrode 120 and the lower source/drain 109, first spacers 137 disposed on a side surface of upper source/drains 112 and on the gate electrode 120, and second spacers 138 covering a side surface of the first spacers 137 and a side surface of the gate electrode 120. The lower spacer layer 131 may have a bent form. The lower spacer layer 131, the first spacers 137, and the second spacers 138 may include, for example, a silicon nitride.

The first spacers 137 may be disposed on a side surface of the protrusions 112*p* of the upper source/drains 112. The gate dielectric layer 115 may extend below the protrusions 112*p* and the first spacers 137. The gate dielectric layer 115 may extend to a lower surface of the first spacers 137. A first dielectric layer 114 may extend to a lower surface of the protrusions 112*p*, while a second dielectric layer 116 may extend to be longer than the first dielectric layer 114 and may extend to the lower surface of the first spacers 137.

A lower surface of the gate electrode 120 may have a protruding portion corresponding to a form of the lower spacer layer 131. The side surface of the gate electrode 120 may be coplanar with the side surface of a first spacer 137. A portion of the gate electrode 120 may extend along the upper surface of the substrate 101 in the second direction. The first gate electrode 120 may include a first conductive layer including, for example, a metal nitride, such as TiN or TaN, and a second conductive layer including, for example, a metal, such as tungsten (W), cobalt (Co), copper (Cu), or aluminum (Al).

The gate dielectric layer 115 may include the first dielectric layer 114 and the second dielectric layer 116. The second dielectric layer 116 may have a dielectric constant higher than that of the first dielectric layer 114. The first dielectric layer 114 may include, for example, a silicon oxide, while the second dielectric layer 116 may include, for example, a high-k dielectric material having a dielectric constant higher than that of a silicon oxide.

The high-k dielectric material may be formed using, for example, one or more of hafnium oxide (HfOx), hafnium silicate (FfSiOx), hafnium oxynitride (HfON), hafnium silicon oxynitride (HfSiON), lanthanum oxide (LaOx), lanthanum oxynitride (LaON), lanthanum aluminum oxide (LaAlOx), zirconium oxide (ZrOx), zirconium silicate (ZrSiOx), zirconium oxynitride (ZrON), zirconium silicon oxynitride (ZrSiON), tantalum oxide (TaOx), titanium oxide (TiOx), titanium oxynitride (TiON), barium strontium titanium oxide (BaSrTiOx), barium titanium oxide (BaTiOx), strontium titanium oxide (SrTiOx), yttrium oxide (YOx), aluminum oxide (AlOx), aluminum oxynitride (AlON), or lead scandium tantalum oxide (PbScTaOx).

The semiconductor device 10 may further include an upper silicide layer 125 disposed on the upper source/drains 112, a lower silicide layer 126 disposed in a portion of the lower source/drain 109, an interlayer insulating layer 170, and contact plugs 130, 140, and 150, penetrating through the interlayer insulating layer 170.

A contact plug 130 may be connected to the lower source/drain 109. The lower silicide layer 126 may be disposed between the contact plug 130 and the lower source/drain 109. A contact plug 140 may be connected to the upper source/drains 112. The upper silicide layer 125 may be disposed between the contact plug 140 and the upper source/drains 112. A contact plug 150 may be connected to the gate electrode 120. The interlayer insulating layer 170 may include a low-k dielectric material. The contact plugs 130, 140, and 150 may include a metal nitride and a metal.

FIGS. 5 to 18 are cross-sectional views of stages in a method of manufacturing a semiconductor device 10 according to an example embodiment.

Figure 5:
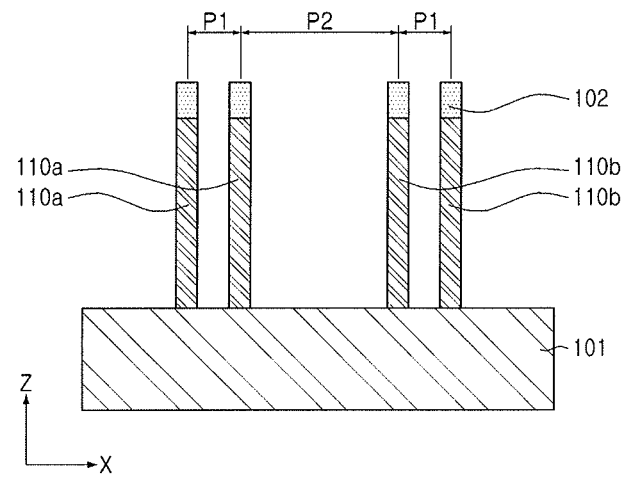
FIGS. 5 to 18 illustrate cross-sectional views of stages in a method of manufacturing a semiconductor device according to an example embodiment.

With reference to FIG. 5, a plurality of active fins 110a and 110b may be formed on a substrate 101 in such a manner that the plurality of active fins 110a and 110b are alternately disposed at a first pitch P1 and a second pitch P2 greater than the first pitch P1 (the first and second pitches P1, P2 being in, for example, the third or X-axis direction). The first active fins 110a may be disposed at the first pitch P1, while the second active fins 110b may be disposed at the first pitch P1. The first active fin 110a and the second active fin 110b disposed adjacent to each other may be disposed at the second pitch P2.

A mask layer 102 may be formed above the substrate 101, while the mask layer 102 may be etched to have the first pitch P1 and the second pitch P2. The mask layer 102 may be etched using, for example, double patterning technology (DPT), quadruple patterning technology (QPT), or a combination thereof. The mask layer 102 having been patterned may be used as an etching mask, and the substrate 101 may be anisotropically etched, thereby forming the plurality of active fins 110a and 110b. The mask layer 102 may remain on the plurality of active fins 110a and 110b. The substrate 101 may be provided as a semiconductor substrate, while the mask layer 102 may be formed using an insulating material. For example, the substrate 101 may be provided as a silicon substrate, while the mask layer 102 may be formed using a silicon nitride.

Figure 6:
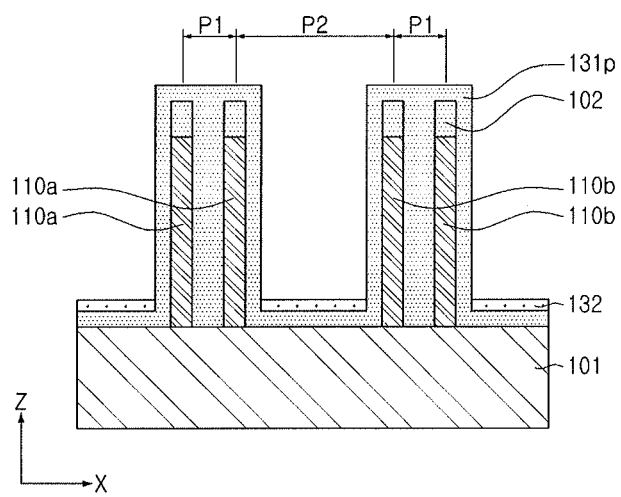

With reference to FIG. 6, a plurality of active fins 110a and 110b, as well as a first insulating layer 131p covering an upper surface of the substrate 101 may be formed on the substrate 101. The first insulating layer 131p may be formed to have a thickness sufficient to entirely fill a space along the third or X-axis direction between the first active fins 110a disposed at the first pitch P1 and a space between the second active fins 110b disposed at the first pitch P1.

The second insulating layer 132 may be formed on the first insulating layer 131p in a region between vertical channel structures CS. The second insulating layer 132 may be formed using a material different from that of the first insulating layer 131p. For example, the first insulating layer 131p may be formed using a silicon nitride, while the second insulating layer 132 may be formed using a silicon oxide.

Figure 7:
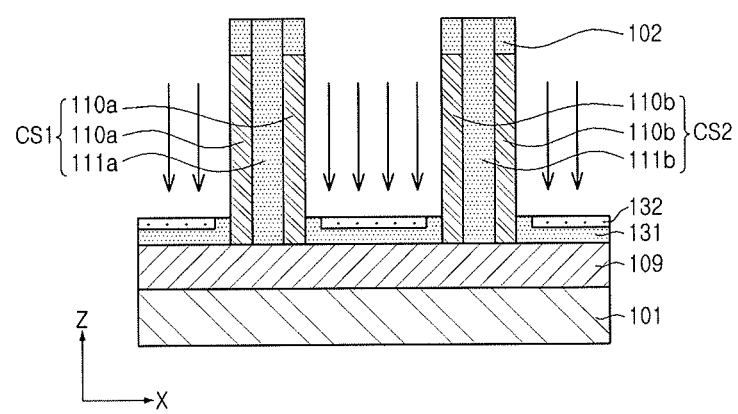

With reference to FIG. 7, a lower source/drain 109 may be formed using an ion implantation process.

For example, the first insulating layer 131p may be wet etched using the second insulating layer 132 as an etching mask. The lower spacer layer 131 may be formed below the second insulating layer 132 using an etching process described above. For example, the lower spacer layer 131 may be between the lower source/drain 109 and the second insulating layer 132, and between the second insulating layer 132 and an adjacent second active fin 110b.

The first insulating portion 111a and the second insulating portion 111b may be formed between the first active fins 110a and the second active fins 110b. A first insulating portion 111a and a pair of first active fins 110a in contact with the first insulating portion 111a may form the first vertical channel structure CS1. A second insulating portion 111b and a pair of second active fins 110b in contact with the second insulating portion 111b may form the second vertical channel structure CS2. Side surfaces of the first active fins 110a and the second active fins 110b in contact with the first insulating portion 111a and the second insulating portion 111b may be referred to as inner side surfaces. The side surfaces of the first active fins 110a and the second active fins 110b not in contact with the first insulating portion 111a and the second insulating portion 111b may be referred to as external side surfaces. The external side surfaces of active fins 110a and 110b may be exposed using the etching process.

Subsequently, the lower source/drain 109 may be formed by ion implantation and diffusion of impurities. After the ion implantation process of impurities, a heat treatment process of activating and diffusing impurities may be performed. In the case of an n-type field effect transistor, lower source/drains 109 may be doped with an n-type impurity. In the case of a p-type field effect transistor, lower source/drains 109 may be doped with a p-type impurity.

Figure 8:
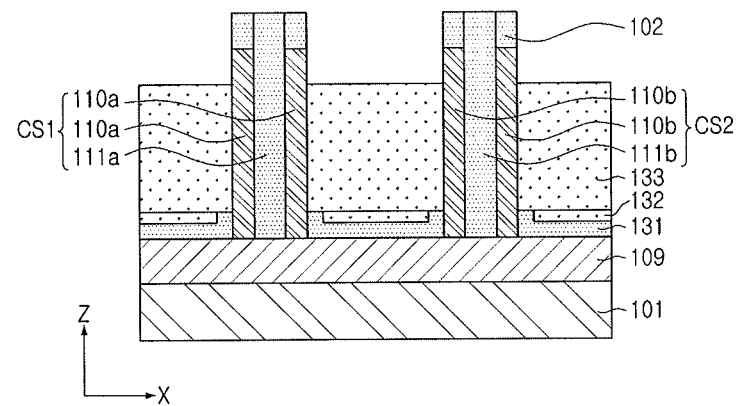

With reference to FIG. 8, a third insulating layer 133 exposing upper portions of external side surfaces of the plurality of active fins 110a and 110b may be formed. The third insulating layer 133 may expose upper portions of the vertical channel structures CS1 and CS2.

The third insulating layer 133 may be formed to cover the plurality of active fins 110a and 110b. Subsequently, the third insulating layer 133 may be partially removed to allow an upper surface of a mask layer 102 to be exposed using, for example, a chemical mechanical polishing (CMP) process. Subsequently, the third insulating layer 133 may be further etched. The third insulating layer 133 may be formed using, for example, a silicon oxide.

Figure 9:
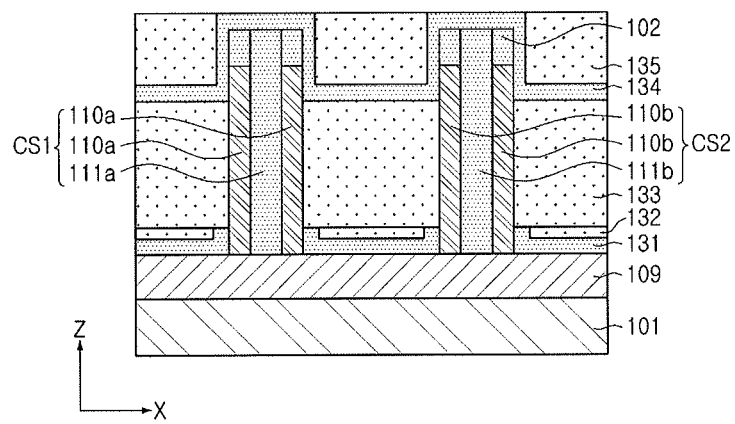

With reference to FIG. 9, a fourth insulating layer 134 covering the third insulating layer 133 and the vertical channel structures CS1 and CS2 may be formed. Subsequently, a fifth insulating layer 135 may be formed on the fourth insulating layer 134. The fifth insulating layer 135 may not be formed on the vertical channel structures CS1 and CS2. An upper surface of the fifth insulating layer 135 may be coplanar with an upper surface of the fourth insulating layer 134. The fourth insulating layer 134 may be formed using a deposition process. The fifth insulating layer 135 may be formed using a deposition process and a CMP process. In detail, the fourth insulating layer 134 may be formed using a silicon oxide, while the fifth insulating layer 135 may be formed using a silicon nitride.

Figure 10:
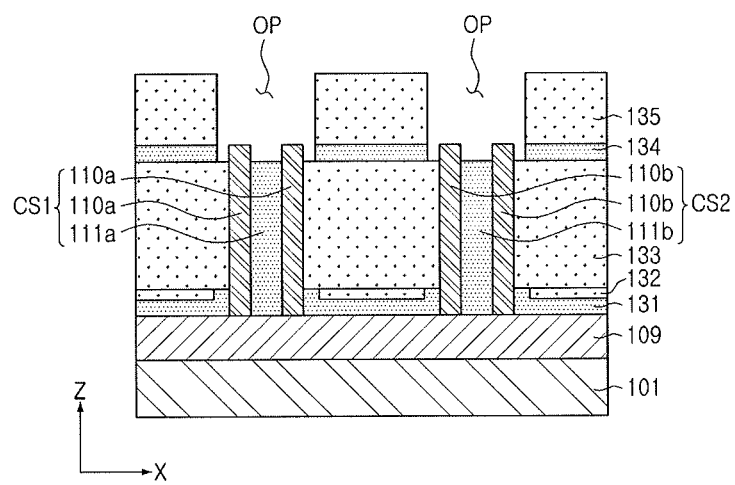

With reference to FIG. 10, openings OP may be formed on the vertical channel structures CS1 and CS2. The fourth insulating layer 134 and the mask layer 102 may be selectively removed using a dry etching process. In this case, upper portions of insulating portions 111a and 111b may be removed together therewith, so that heights of the insulating portions 111a and 111b may be reduced. In addition, upper portions of the plurality of active fins 110a and 110b may also be removed, so that heights of the plurality of active fins 110a and 110b may be reduced. Upper surfaces of the insulating portions 111a and 111b may be lower than those of the plurality of active fins 110a and 110b. In an example embodiment, the upper surfaces of the insulating portions 111a and 111b may be lower than an upper surface of the third insulating layer 133.

Figure 11:
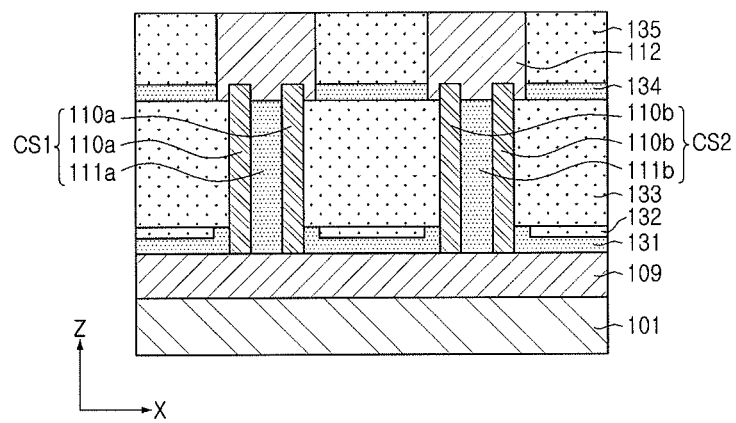

With reference to FIG. 11, upper source/drains 112 may be formed in the openings OP. A semiconductor layer may be grown from the plurality of active fins 110a and 110b to be exposed in the openings OP using a selective epitaxial growth (SEG) process, and the semiconductor layer grown outwardly of the openings OP may be removed using the CMP process, thereby forming the upper source/drains 112. The upper source/drains 112 may be doped with impurities. Impurities may be implanted while the semiconductor layer is grown. The upper source/drains 112 may be formed using, for example, doped silicon (Si) or doped SiGe.

Figure 12:
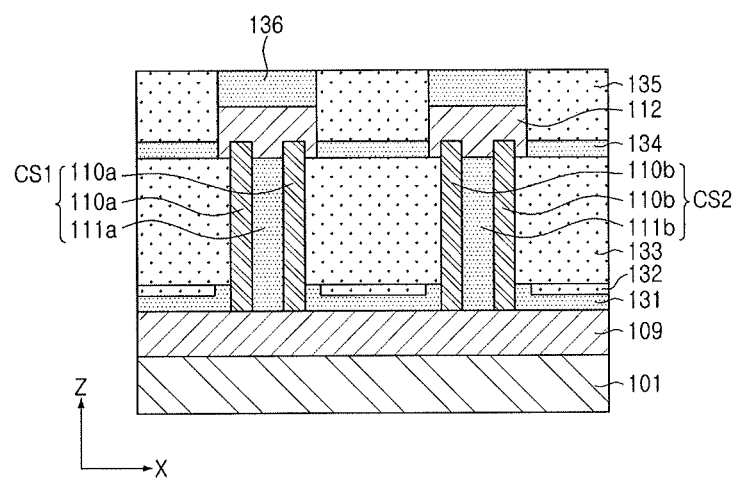

With reference to FIG. 12, the upper source/drains 112 may be partially removed, and sixth insulating layers 136 may be formed. Upper surfaces of the sixth insulating layers 136 may be coplanar with the upper surface of the fifth insulating layer 135. A sixth insulating layer 136 may be formed using, for example, a deposition process and the CMP process. The sixth insulating layer 136 may be formed using, for example, a silicon nitride.

Figure 13:
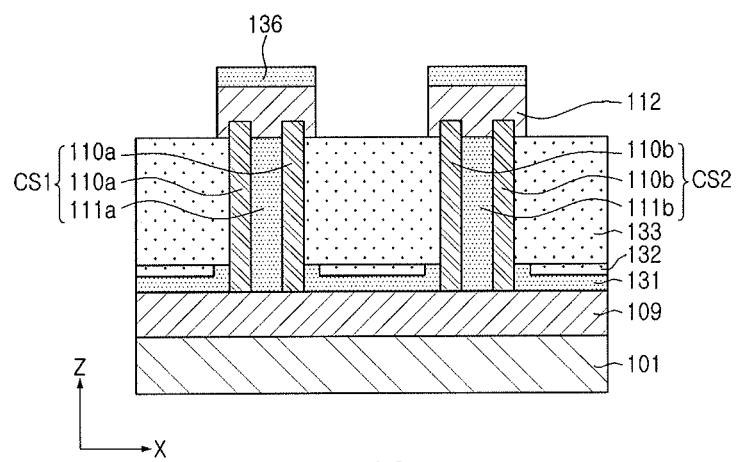

With reference to FIG. 13, the fifth insulating layer 135 and the fourth insulating layer 134 may be sequentially removed. The fifth insulating layer 135 and the fourth insulating layer 134 may be removed using the dry etching process or a wet etching process. A portion of the sixth insulating layer 136 may be removed together therewith, thereby reducing a thickness of the sixth insulating layer 136.

Figure 14:
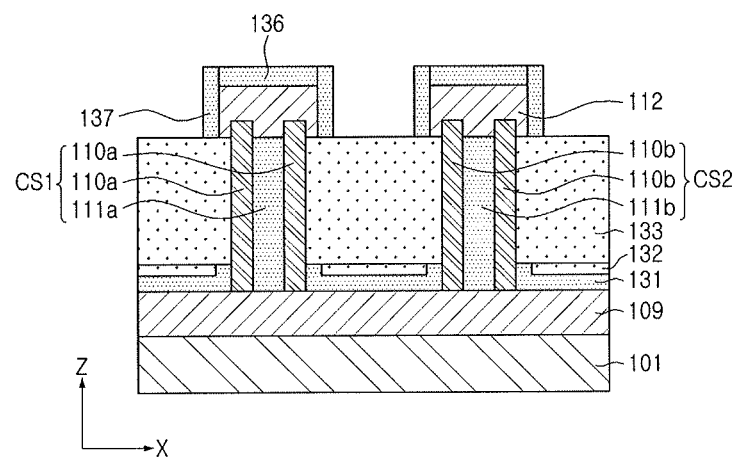

With reference to FIG. 14, first spacers 137 may be formed on side surfaces of the upper source/drains 112. The first spacers 137 may be formed using, for example, the deposition process and the dry etching process. The first spacers 137 may be formed using, for example, a silicon nitride.

Figure 15:
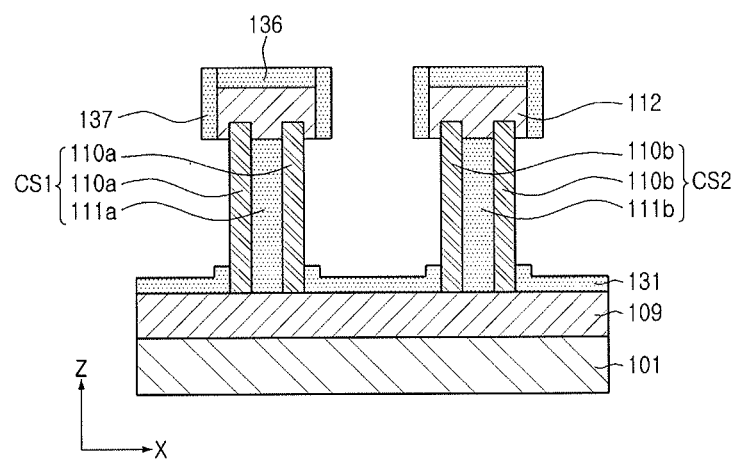

With reference to FIG. 15, the third insulating layer 133 and the second insulating layer 132 may be removed.

The external side surfaces of the plurality of active fins 110a and 110b may be exposed. A lower surface of a portion of the upper source/drains 112 may be exposed. The upper source/drains 112 may have a width in the third or X-axis direction that is greater than those of the underlying vertical channel structures CS1 and CS2. Thus, the upper source/drains 112 may include protrusions protruding further than side surfaces of the vertical channel structures CS1 and CS2 in the third or X-axis direction. The third insulating layer 133 and the second insulating layer 132 may be removed using the wet etching process.

Figure 16:
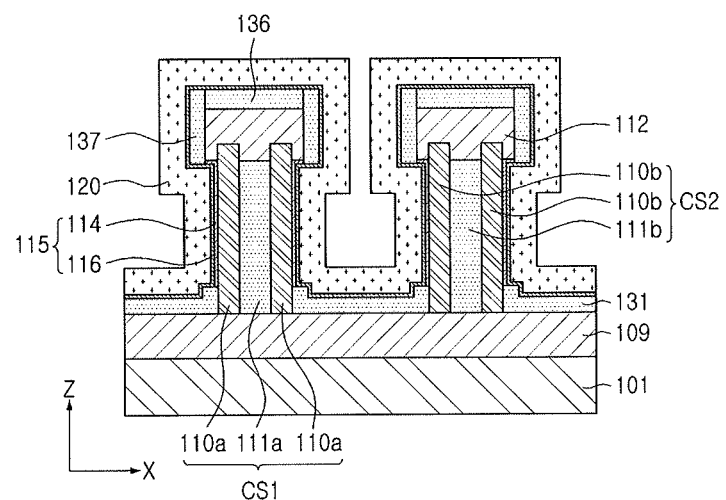

With reference to FIG. 16, a gate dielectric layer 115 and a gate electrode 120 may be formed to cover the side surfaces of the plurality of active fins 110a and 110b, as well as the first spacers 137.

The gate dielectric layer 115 may include a first dielectric layer 114 and a second dielectric layer 116. The first dielectric layer 114 may be selectively formed on the external side surfaces of the plurality of active fins 110a and 110b and on lower surfaces of the protrusions of the upper source/drains 112. The first dielectric layer 114 may be formed using a thermal oxidation process, a plasma oxidation process, a radical oxidation process, or the like. The first dielectric layer 114 may be formed using, for example, a silicon oxide.

Subsequently, the second dielectric layer 116 covering lower spacer layers 131, the first dielectric layer 114, the first spacers 137, and the sixth insulating layers 136 may be formed. The second dielectric layer 116 may be formed using, for example, a high-k dielectric material.

Subsequently, the gate electrode 120 covering the second dielectric layer 116 may be formed. The gate electrode 120 may include a first conductive layer and a second conductive layer. The first conductive layer may include, for example, a metal nitride, such as TiN or TaN, while the second conductive layer may include, for example, a metal, such as W, Co, Cu, or Al.

The second dielectric layer 116 and the gate electrode 120 may be formed using the deposition process.

Figure 17:
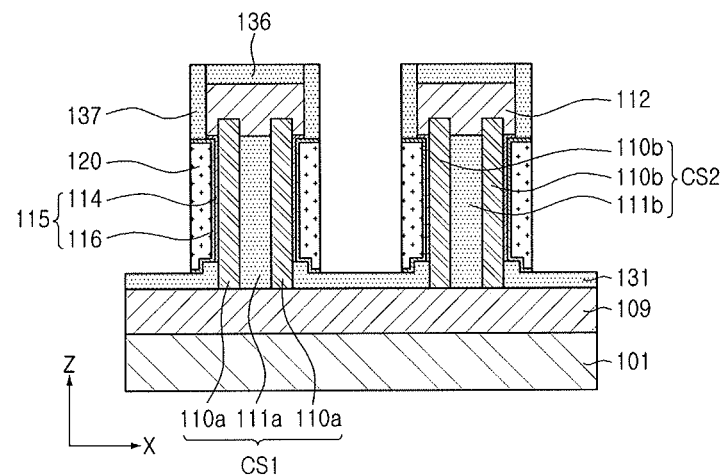

With reference to FIG. 17, the gate dielectric layer 115 and the gate electrode 120 may be partially removed. The gate electrode 120 may only remain below the first spacers 137 using the etching process. Side surfaces of the first spacers 137 may be coplanar with side surfaces of the gate electrode 120. The second dielectric layer 116 of the gate dielectric layer 115 may be partially removed. The second dielectric layer 116 may only remain below the first spacers 137. The first spacers 137 may function as an etching mask. The gate electrode 120 and the second dielectric layer 116 may be removed using, for example, an anisotropic dry etching process.

Figure 18:
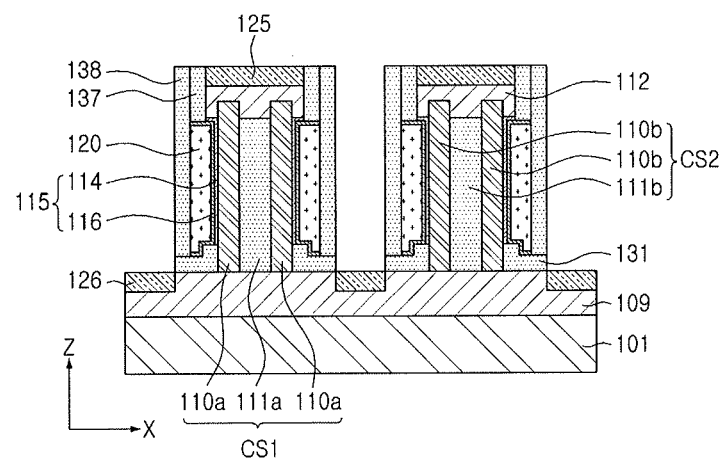

With reference to FIG. 18, upper silicide layers 125 may be formed on the upper source/drains 112, while lower silicide layers 126 may be formed on the lower source/drain 109.

The second spacers 138 may be formed to cover the side surfaces of the gate electrode 120, and may extend in the first or Z-axis direction so as to completely cover the side surfaces of the gate electrode 120. The second spacers 138 may be formed using the deposition process and the anisotropic dry etching process. The sixth insulating layer 136 on the upper source/drains 112 may be removed, and the lower spacer layer 131 on the lower source/drain 109 may be partially removed using the anisotropic etching process. Subsequently, the upper silicide layers 125 and the lower silicide layers 126 may be formed on the upper source/drains 112 and the lower source/drain 109, having been exposed, respectively.

With reference to FIGS. 2 and 4, an interlayer insulating layer 170 covering structures on the substrate 101 illustrated in FIG. 18 may be formed, and then contact plugs 130, 140, and 150, penetrating through the interlayer insulating layer 170 may be formed.

A contact plug 130 may penetrate through the interlayer insulating layer 170 to be connected to the lower source/drain 109 of the substrate 101. A contact plug 140 may penetrate through the interlayer insulating layer 170 to be connected to the upper source/drains 112. A contact plug 150 may penetrate through the interlayer insulating layer 170 to be connected to the gate electrode 120.

Figure 19:
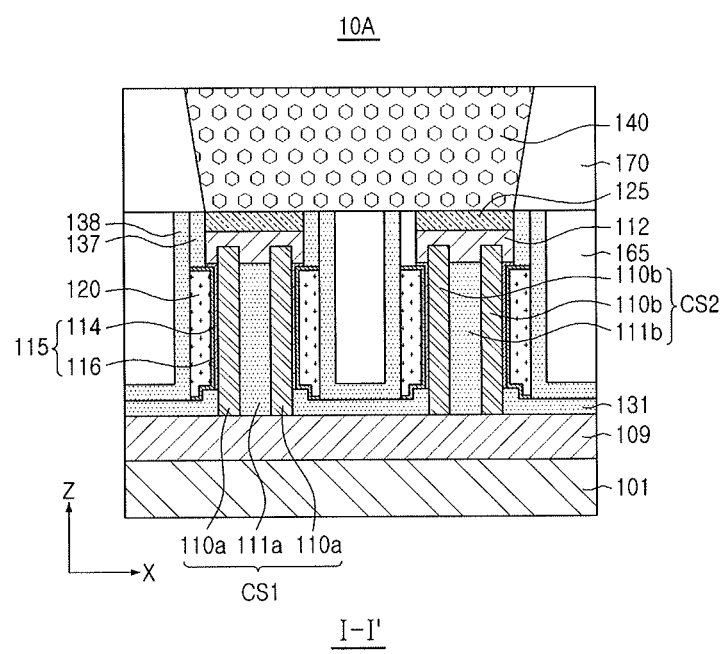
FIGS. 19 to 20 illustrate cross-sectional views of a semiconductor device according to an example embodiment.
Figure 20:
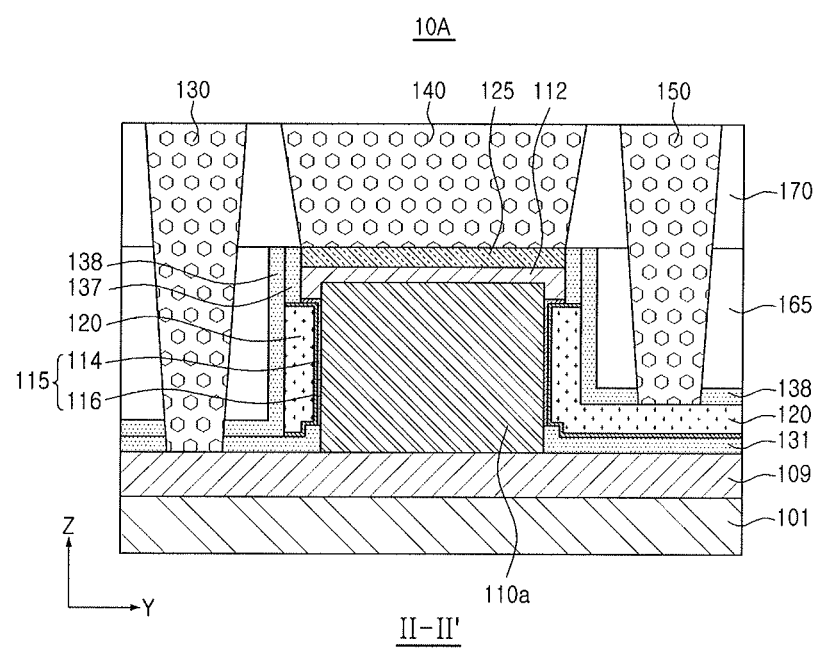

FIGS. 19 to 20 are cross-sectional views of a semiconductor device according to an example embodiment. In terms of a semiconductor device 10A illustrated in FIGS. 19 and 20, only differences from the semiconductor device 10 illustrated in FIGS. 2 and 4 will be described.

With reference to FIGS. 19 and 20, the semiconductor device 10A may not include lower silicide layers 126. A lower spacer layer 131 may cover a lower source/drain 109, while a second spacer 138 may cover the lower spacer layer 131. A first interlayer insulating layer 165 may cover the second spacer 138, while a second interlayer insulating layer 170 may be disposed on the first interlayer insulating layer 165.

Figure 21:
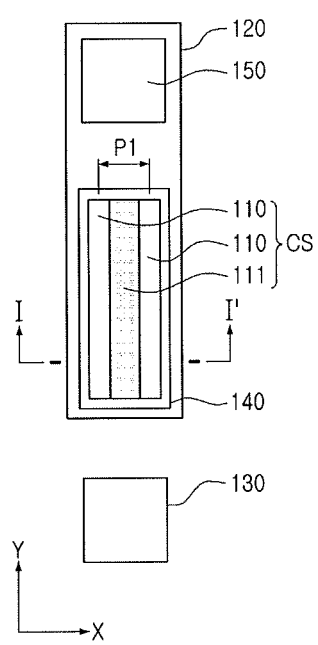
FIG. 21 illustrates a layout of a semiconductor device according to an example embodiment.
Figure 22:
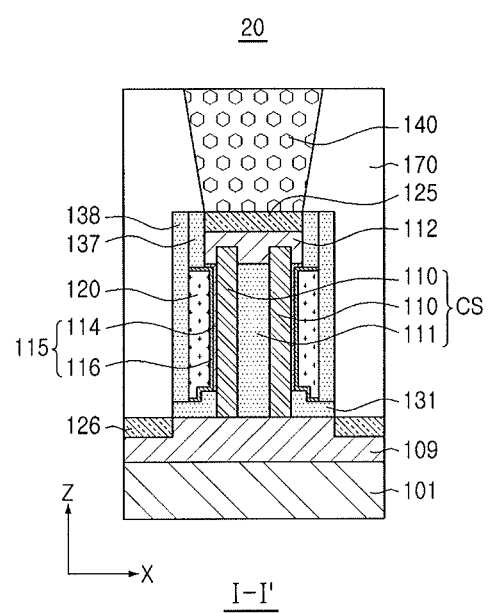
FIG. 22 illustrates a cross-sectional view taken along line I-I' of a semiconductor device illustrated in FIG. 21.

FIG. 21 is a layout of a semiconductor device according to an example embodiment. FIG. 22 is a cross-sectional view taken along line I-I' of a semiconductor device illustrated in FIG. 21. In terms of a semiconductor device 20 illustrated in FIGS. 21 and 22, only differences from a semiconductor device 10 illustrated in FIGS. 2 and 4 will be described.

The semiconductor device 20 illustrated in FIGS. 21 and 22 may include a single vertical channel structure CS. A gate electrode 120 may surround a pair of active fins 110 disposed at a first pitch P1 and side surfaces of the vertical channel structure CS including an insulating portion 111.

Figure 23:
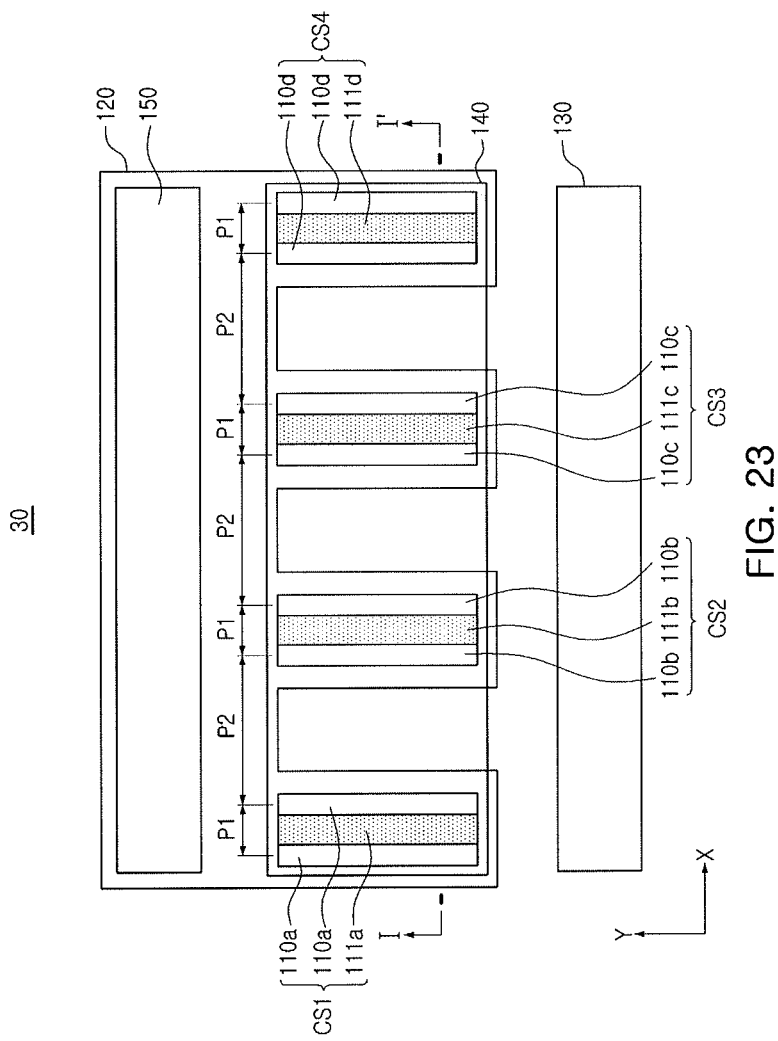
FIG. 23 illustrates a layout of a semiconductor device according to an example embodiment.
Figure 24:
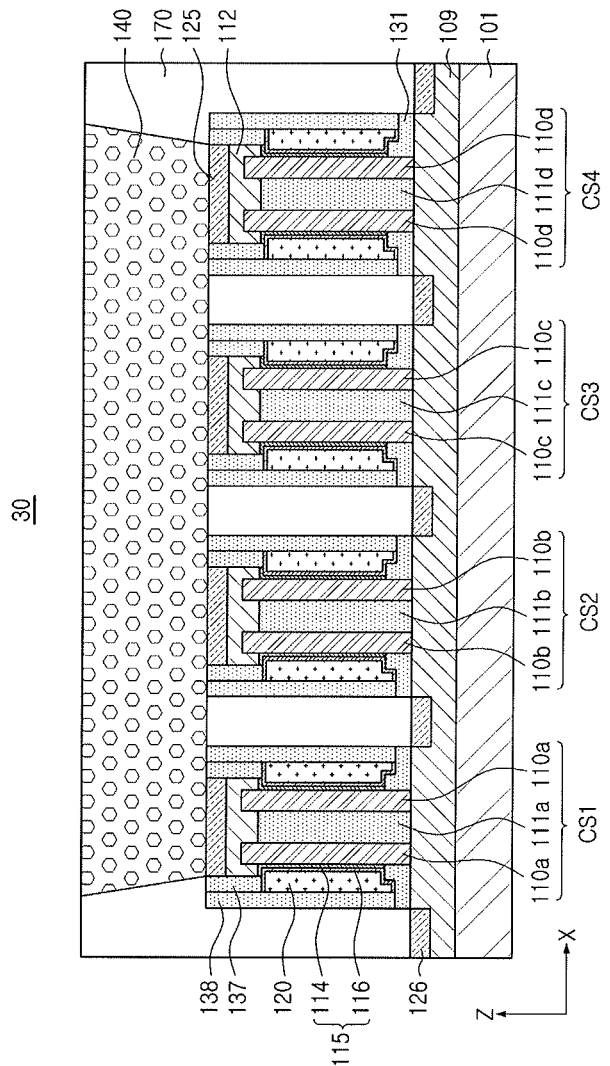
FIG. 24 illustrates a cross-sectional view taken along line I-I' of a semiconductor device illustrated in FIG. 23.

FIG. 23 is a layout of a semiconductor device according to an example embodiment. FIG. 24 is a cross-sectional view taken along line I-I' of a semiconductor device illustrated in FIG. 23. In terms of a semiconductor device 30 illustrated in FIGS. 23 and 24, only differences from a semiconductor device 10 illustrated in FIGS. 2 and 4 will be described.

The semiconductor device 30 illustrated in FIGS. 23 and 24 may include four vertical channel structures CS1, CS2, CS3, and CS4. A first vertical channel structure CS1 may include a pair of first active fins 110a disposed at a first pitch P1 and a first insulating portion 111a. A second vertical channel structure CS2 may include a pair of second active fins 110b disposed at the first pitch P1 and a second insulating portion 111b. A third vertical channel structure CS3 may include a pair of third active fins 110c disposed at the first pitch P1 and a third insulating portion 111c. A fourth vertical channel structure CS4 may include a pair of fourth active fins 110d disposed at the first pitch P1 and a fourth insulating portion 111d. The first active fin 110a and the second active fin 110b disposed adjacent to each other may be disposed at a second pitch P2 greater than the first pitch P1. A second active fin 110b and a third active fin 110c, disposed adjacent to each other, may be disposed at the second pitch P2 greater than the first pitch P1. A third active fin 110c and a fourth active fin 110d, disposed adjacent to each other, may be disposed at the second pitch P2 greater than the first pitch P1.

A gate electrode 120 may surround side surfaces of the four vertical channel structures CS1, CS2, CS3, and CS4. A contact plug 140 may be connected to an entirety of upper source/drains 112 disposed on vertical channel structures CS1, CS2, CS3, and CS4

As set forth above, example embodiments may provide a semiconductor device having a structure appropriate for scaling. According to example embodiments, a change in a threshold voltage may not occur during a manufacturing process, and resistance variation of the semiconductor device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
a vertical channel structure including a pair of active fins extended in a first direction, perpendicular to an upper surface of the substrate, and an insulating portion interposed between the pair of active fins;
an upper source/drain disposed on the vertical channel structure and including a protrusion that protrudes in the first direction along a side surface of the vertical channel structure;
a spacer disposed on a side surface of the protrusion of the upper source/drain;
a lower source/drain disposed below the vertical channel structure and on the substrate;
a gate electrode disposed between the upper source/drain and the lower source/drain and surrounding the vertical channel structure; and
a gate dielectric layer disposed between the gate electrode and the vertical channel structure,
wherein:
the protrusion of the upper source/drain protrudes toward the gate electrode, and
a first interval between the gate electrode and the upper source/drain is smaller than a second interval between the gate electrode and the lower source/drain in the first direction.

2. The semiconductor device as claimed in claim 1, wherein the first interval between the gate electrode and the upper source/drain in the first direction is equal to a thickness of the gate dielectric layer.

3. The semiconductor device as claimed in claim 1, wherein the first interval is between the protrusion the gate electrode in the first direction.

4. The semiconductor device as claimed in claim 3, wherein a length of the protrusion, protruding from the side surfaces of the vertical channel structure in a second direction, is greater than a thickness of the gate dielectric layer.

5. The semiconductor device as claimed in claim 3, wherein the gate dielectric layer is extended below the protrusion.

6. The semiconductor device as claimed in claim 1, wherein the gate dielectric layer includes a first dielectric layer and a second dielectric layer, the first dielectric layer is extended to a lower surface of the protrusion, and the second dielectric layer is extended to be longer than the first dielectric layer and extended to a lower surface of the spacer.

7. The semiconductor device as claimed in claim 6, wherein the second dielectric layer has a dielectric constant higher than a dielectric constant of the first dielectric layer.

8. The semiconductor device as claimed in claim 1, wherein a side surface of the spacer is coplanar with a side surface of the gate electrode.

9. The semiconductor device as claimed in claim 1, wherein an upper surface of the insulating portion is lower than upper surfaces of the pair of active fins.

10. The semiconductor device as claimed in claim 9, wherein an upper surface of the insulating portion is higher than an upper surface of the gate electrode.

11. The semiconductor device as claimed in claim 1, wherein the gate dielectric layer is interposed between the gate electrode and the upper source/drain, and between the gate electrode and the lower source/drain.

12. The semiconductor device as claimed in claim 1, wherein the gate dielectric layer includes a first dielectric layer and a second dielectric layer, the second dielectric layer having a dielectric constant higher than a dielectric constant of the first dielectric layer.

13. A semiconductor device, comprising:
a substrate;
a first vertical channel structure including a pair of first active fins disposed at a first pitch and a first insulating portion interposed between the pair of first active fins on the substrate;
a second vertical channel structure including a pair of second active fins disposed at the first pitch and a second insulating portion interposed between the pair of second active fins on the substrate;
upper source/drains disposed on the first vertical channel structure and the second vertical channel structure, the upper source/drains disposed on the first vertical channel structure and the second vertical channel structure being connected to a same contact plug;
a lower source/drain disposed below the first vertical channel structure and the second vertical channel structure; and
a gate electrode disposed between the upper source/drains and the lower source/drain and surrounding the first vertical channel structure and the second vertical channel structure,
wherein the pair of first active fins and the pair of second active fins are disposed adjacent to each other, and are disposed at a second pitch greater than the first pitch.

14. The semiconductor device as claimed in claim 13, wherein an interval between the gate electrode and the upper source/drains is less than an interval between the gate electrode and the lower source/drain in a direction perpendicular to an upper surface of the substrate.

15. The semiconductor device as claimed in claim 13, further comprising a gate dielectric layer disposed between the gate electrode and the first vertical channel structure and between the gate electrode and the second vertical channel structure,
wherein an interval between the gate electrode and the upper source/drains in a direction perpendicular to an upper surface of the substrate is equal to a thickness of the gate dielectric layer.

16. The semiconductor device as claimed in claim 15, further comprising spacers disposed on a side surface of the upper source/drains.

17. The semiconductor device as claimed in claim 16, wherein the gate dielectric layer is extended to a lower surface of the spacers.

18. The semiconductor device as claimed in claim 16, wherein a side surface of the spacers is coplanar with a side surface of the gate electrode.

19. A semiconductor device, comprising:
a substrate;
a vertical channel structure including a pair of active fins extended in a first direction, perpendicular to an upper surface of the substrate, and an insulating portion interposed between the pair of active fins;
an upper source/drain disposed on the vertical channel structure;
a lower source/drain disposed below the vertical channel structure and on the substrate;
a gate electrode disposed between the upper source/drain and the lower source/drain and surrounding the vertical channel structure; and
a gate dielectric layer disposed between the gate electrode and the vertical channel structure,
wherein:
an interval between the gate electrode and the upper source/drain is smaller than an interval between the gate electrode and the lower source/drain in the first direction, and
the upper source/drain includes a protrusion and a spacer disposed on a side surface of the protrusion, the protrusion protruding beyond side surfaces of the vertical channel structure, and a portion of the gate electrode overlaps the protrusion in the first direction.

* * * * *